United States Patent
Nusseibeh

(10) Patent No.: US 10,575,395 B2
(45) Date of Patent: Feb. 25, 2020

(54) BAND PASS FILTER-BASED GALVANIC ISOLATOR

(71) Applicant: Honeywell International Inc., Morris Plains, NJ (US)

(72) Inventor: Fouad Nusseibeh, Champlin, MN (US)

(73) Assignee: Honeywell International Inc., Morris Plains, NJ (US)

( * ) Notice: Subject to any disclaimer, the term of this patent is extended or adjusted under 35 U.S.C. 154(b) by 852 days.

(21) Appl. No.: 15/175,295

(22) Filed: Jun. 7, 2016

(65) Prior Publication Data

US 2017/0354028 A1    Dec. 7, 2017

(51) Int. Cl.
| | |
|---|---|
| *H05K 1/02* | (2006.01) |
| *H01P 1/203* | (2006.01) |
| *G01F 23/284* | (2006.01) |
| *H01P 3/08* | (2006.01) |
| *H03H 7/01* | (2006.01) |
| *H05K 1/16* | (2006.01) |
| *H05K 3/46* | (2006.01) |

(52) U.S. Cl.
CPC ........... *H05K 1/025* (2013.01); *G01F 23/284* (2013.01); *H01P 1/20363* (2013.01); *H01P 3/08* (2013.01); *H03H 7/01* (2013.01); *H05K 1/0239* (2013.01); *H05K 1/0245* (2013.01); *H05K 1/0259* (2013.01); *H05K 1/162* (2013.01); *H05K 3/4694* (2013.01); *H05K 2201/09236* (2013.01); *H05K 2201/09609* (2013.01)

(58) Field of Classification Search
None
See application file for complete search history.

(56) References Cited

U.S. PATENT DOCUMENTS

| | | | |
|---|---|---|---|
| 3,654,393 A | 4/1972 | Schenkel | |
| 6,256,850 B1 | 7/2001 | Lauffer et al. | |
| 2006/0092594 A1* | 5/2006 | Hwang | H01G 4/40 361/306.3 |
| 2008/0061631 A1 | 3/2008 | Fouquet et al. | |
| 2008/0074309 A1* | 3/2008 | Nilsson | G01F 23/284 342/124 |
| 2009/0295623 A1* | 12/2009 | Falk | G01S 7/023 342/109 |
| 2012/0002377 A1 | 1/2012 | French et al. | |
| 2012/0262254 A1 | 10/2012 | Dremelj et al. | |
| 2013/0162439 A1* | 6/2013 | Schumacher | G01F 15/068 340/691.6 |

(Continued)

FOREIGN PATENT DOCUMENTS

GB     544775     4/1942

*Primary Examiner* — Whitney Moore

(57) ABSTRACT

A galvanic isolator includes a multi-layer printed circuit board (PCB) including a dielectric material having a top side and a bottom side. An RF transmission line is embedded within the PCB including a plurality of conductor traces spaced apart from one another to include a plurality of gaps (G1 and G2) in a path of the RF transmission line to provide an inline distributed capacitor that together with an impedance of the RF transmission line forms a bandpass (BP) filter. A top metal layer is on the top side and a bottom metal layer on the bottom side connected to one another by a plurality of metal filled vias on respective sides of the RF transmission line. The top metal layer and bottom metal layer each also include at least one gap.

16 Claims, 5 Drawing Sheets

(56) References Cited

U.S. PATENT DOCUMENTS

| | | | |
|---|---|---|---|
| 2013/0180104 A1* | 7/2013 | Moul | H01P 11/003 29/846 |
| 2014/0346887 A1 | 11/2014 | Bhamidipati et al. | |
| 2016/0146924 A1 | 5/2016 | Williams | |

* cited by examiner

BAND PASS FILTER-BASED GALVANIC ISOLATOR

FIELD

Disclosed embodiments relate to galvanic isolators.

BACKGROUND

Industrial plants having containers or tanks ("tanks") generally need to regularly measure the level of liquid(s) or other product materials therein such as powders. There are several types of systems and techniques used for level measurement, which generally utilize time domain reflectometry (TDR) which relies on analyzing echoes.

For TDR-based measurements, there are contact level measurements, where a part of the system, such as a probe, contacts the material being measured, and non-contact level measurements where the level is measured with an antenna that is positioned above and without contacting the material to be measured. Guided wave radar (GWR) is a particular contact pulsed radar method used to measure the level of liquids or solids in a tank. Non-contact methods include ultrasound which uses high-frequency sonic (sound) waves to detect the level, and radar which uses electromagnetic energy at radio frequencies (RF) which propagates through free-space.

Radar-based tank gauging systems generally need an explosive proof and intrinsic safe (IS) system. IS limits the electrical and thermal energy to safe levels. Under normal conditions, the IS device is passive and allows the tank gauging system to function properly. Under fault conditions, the IS device protects the field circuit (e.g., radar level gauge (RLG)) by preventing excess voltage and current from reaching the hazardous area. The basic circuit for an IS barrier generally has three components that limit current and voltage: a resistor, at least two zener diodes, and a fuse. The resistor limits the current to a specific value known as the short circuit current, Isc. The zener diode limits the voltage to a value referred to as open circuit voltage, Voc. The fuse will blow when the zener diode conducts which interrupts the circuit that prevents the zener diode from burning up and allowing excess voltage to reach the hazardous area. There always are at least two zener diodes in parallel in each intrinsically safe barrier so that if one zener diode should fail, the other will operate providing complete IS protection.

An explosion proof arrangement includes a housing designed to contain an explosion. In a fault condition, the fault may create an explosion, but the container will contain the explosion. A radar level gauge can be installed in an explosion proof enclosure.

The RF signal in the non-contact radar must generally also have galvanic isolation for protection. Galvanic isolation is used where two or more electric circuits must communicate, but their grounds may be at different potentials. Galvanic isolation isolates functional sections of electrical systems to prevent direct current flow by breaking the direct current path. Energy or information is instead exchanged between the galvanically isolated sections by non-direct connections, such as capacitive, inductive (transformers), electromagnetic waves, optical, acoustical or mechanical arrangements. In tank gauging galvanic isolation is used for safety by preventing explosions in the tank, particularly when there is a flammable material in the tank.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize using known capacitors and zener diodes for intrinsic safety (IS) circuits introduces attenuation and distortion of the RF signal when used in non-contact radar (NCR) where a carrier frequency of at least 10 GHz is generally used, rendering such IS arrangements generally unsuitable for NCR. Moreover, the needed physical area of the capacitor to realize the needed capacitance value can be too large to be practical, and for the zener diodes, for the signal switching speed of the carrier signal the equivalent junction capacitance value of the zener diode can be high enough in capacitance to result in essentially a short (acting as a low pass filter) at the carrier frequency.

Disclosed embodiments utilize a printed circuit board (PCB)-based embedded bandpass (BP) filter having gaps in an embedded microstrip line to provide a distributed capacitance that together with the microstrip line impedance provides a BP filter having a passband that includes (e.g., centered around) the carrier frequency. Disclosed filters are placed between the RF output of the transceiver circuit and the process connector that is connected to the antenna in the tank. Disclosed BP filters thus pass RF signals only at or near the carrier frequency, and isolate or filter out all other frequencies that lie outside the passband of the BP filter.

One disclosed embodiment comprises a galvanic isolator that includes a multi-layer PCB including a dielectric material having a top side and a bottom side. An RF transmission line is embedded within the PCB including a plurality of conductor traces spaced apart from one another to include a plurality of gaps (e.g., G1 and G2) in a path of the transmission line to provide an inline distributed capacitor that together with an impedance of the transmission line forms a BP filter. A top metal layer is on the top side and a bottom metal layer on the bottom side connected to one another by a plurality of metal vias on respective sides of the RF transmission line. The top metal layer and bottom metal layer each also include at least one gap.

DETAILED DESCRIPTION

Figure 1A:
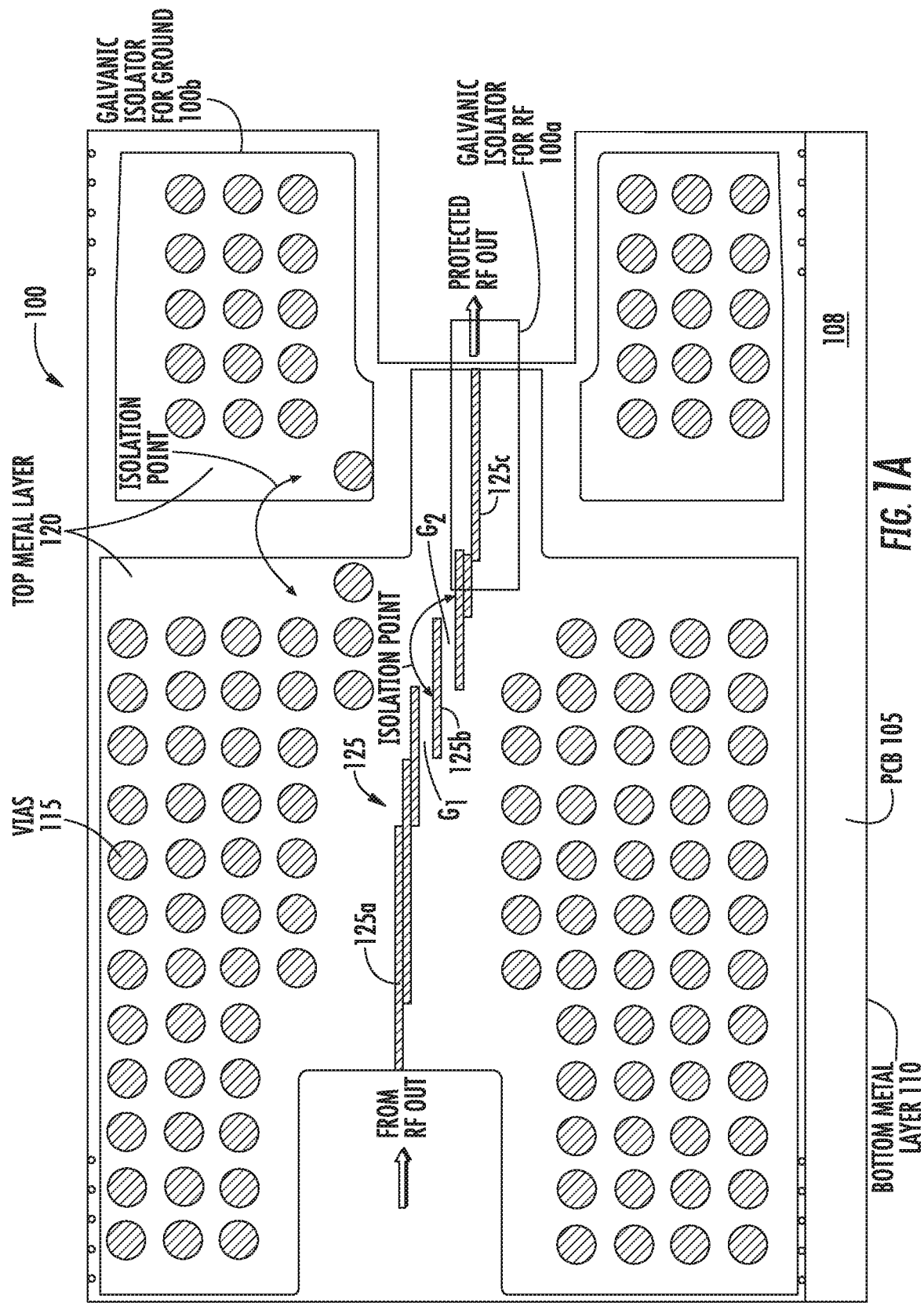
FIG. 1A is an enhanced top view of an example BP filter-based galvanic isolator, according to an example embodiment.

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1B:
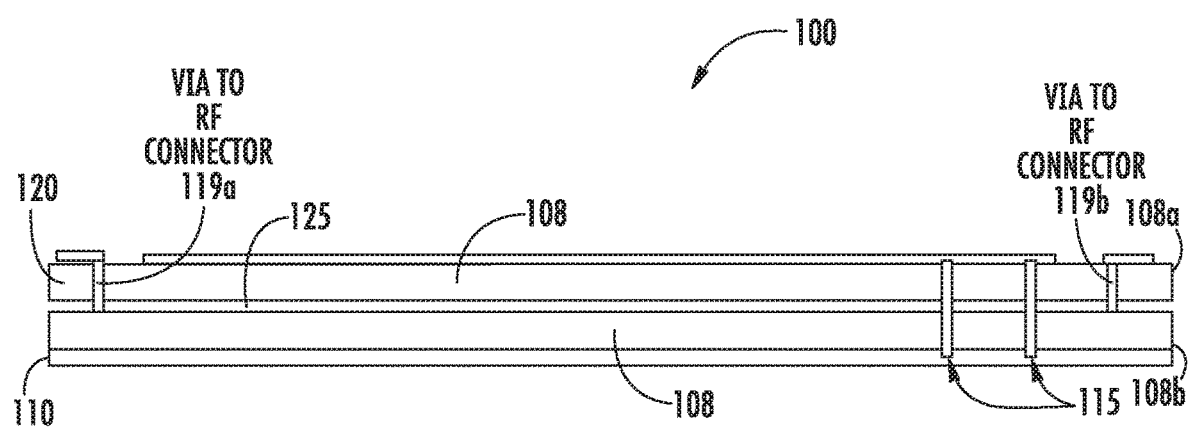
FIG. 1B is a side view showing the layers of an example BP filter-based galvanic isolator shown, according to an example embodiment.

FIG. 1A is an enhanced top view of an example BP filter-based galvanic isolator 100 according to an example embodiment. The arcs with arrows on the ends extending between respective regions shown in FIG. 1A indicate the galvanic isolation (shown as "isolation points") for ground 100b and the galvanic isolation for the RF signal 100a that are both provided by the galvanic isolator 100. Galvanic isolator 100 is in a symmetric stripline arrangement formed using a multi-level PCB 105 having an RF transmission line 125 comprising conductor traces 125a, 125b and 125c spaced apart from one another to include a plurality of gaps (shown as $G_1$ and $G_2$) embedded in a dielectric material 108 (e.g., core or pre-preg) to provide an inline distributed capacitor that together with an impedance of the transmission line 125 forms a bandpass (BP) filter. FIG. 1B shows the layers of an example BP filter-based galvanic isolator shown, according to an example embodiment. Although not shown, in this view the conductor traces (125a, 125b and 125c shown in FIG. 1A) of the RF transmission line 125 are overlapping, with 125a overlapping 125b, and 125b overlapping 125c. Vias providing a connection from the top metal layer 120 to the transmission line 125 are shown as 119a and 119b.

Disclosed BP filters being embedded in the PCB 105 reduce the size of the gaps (G1, G2) in the transmission line 125 to generally less than 1 mm, while using air as the dielectric would generally need the gaps to be more that 3 mm in size. There is no specific gap value since the gap value will also depend on the length of the overlap length of the conductor traces 125a, 125b and 125c. However, the capacitance value will generally be >0.3 pf, such as from 0.3 pF to 50 pF to provide a low impedance at the system carrier frequency (e.g., 25 GHz) to provide a BP filter that will work at the carrier frequency needed.

The dielectric material 108 has a top side 108a and a bottom side 108b. A top metal layer 120 is on the top side 108a and a bottom metal layer 110 on the bottom side 108b connected to one another by a plurality of metal vias 115 on respective sides of the RF transmission line 125 thus being in a stripline arrangement. The metal vias 115 generally comprise metal-filled vias. The metal can comprise copper for the bottom metal layer 110, vias 115 and the top metal layer 120. The top metal layer 120 for a top ground plane and bottom metal layer 110 for a bottom ground plane each also include at least one gap needed for IS (gaps shown in the top metal layer 120 in FIG. 1A and in FIG. 1B), so that there is no direct path for either the signal ground or the chassis ground.

The transmission line 125, i.e. the trace and planes, form the controlled impedance and the gaps ($G_1$ and $G_2$) in the transmission line 125 to provide the respective capacitors. The value of the impedance of the transmission line 125 is determined by its physical construction and electrical characteristics of the dielectric material 108, the width and thickness of the line traces of the transmission line 125, the dielectric constant and height of the dielectric material 108 on either side of the traces, and the configuration of traces, top metal layer 120 and bottom metal layer 110.

The propagation velocity in a material is known to be primarily dependent on the Relative Permittivity (Er) of the material which is roughly inversely proportional to the square root of the dielectric constant of the material. Assuming an Er value of about 4 for the dielectric constant for example materials G-10 or FR-4 for dielectric 108 (the actual value will depend on frequency and the glass to resin ratio), the propagation velocity will approximate to half the speed of light.

The return current path for high frequency signal traces is located directly above and below the signal trace on the ground/power planes provided by the top metal layer 120 and bottom metal layer 110. The high frequency carrier signal is thus contained entirely inside the PCB 105, minimizing emissions, and providing natural shielding against incoming spurious signals.

The width or frequency range of the BP filter's bandwidth can be very small and selective, or very wide and non-selective depending upon the values of R and C used. While the signal frequency is outside the BP filter's passband, the input signal is reflected at the input port. The center or resonant frequency point of the BP filter is the geometric mean of the lower and upper cut-off points. At this center frequency the output signal is at its maximum and the phase shift of the output signal is the same as the input signal. The BP filter can be a first order filter, or a higher order filter, such as second or third order filter.

Figure 2A:
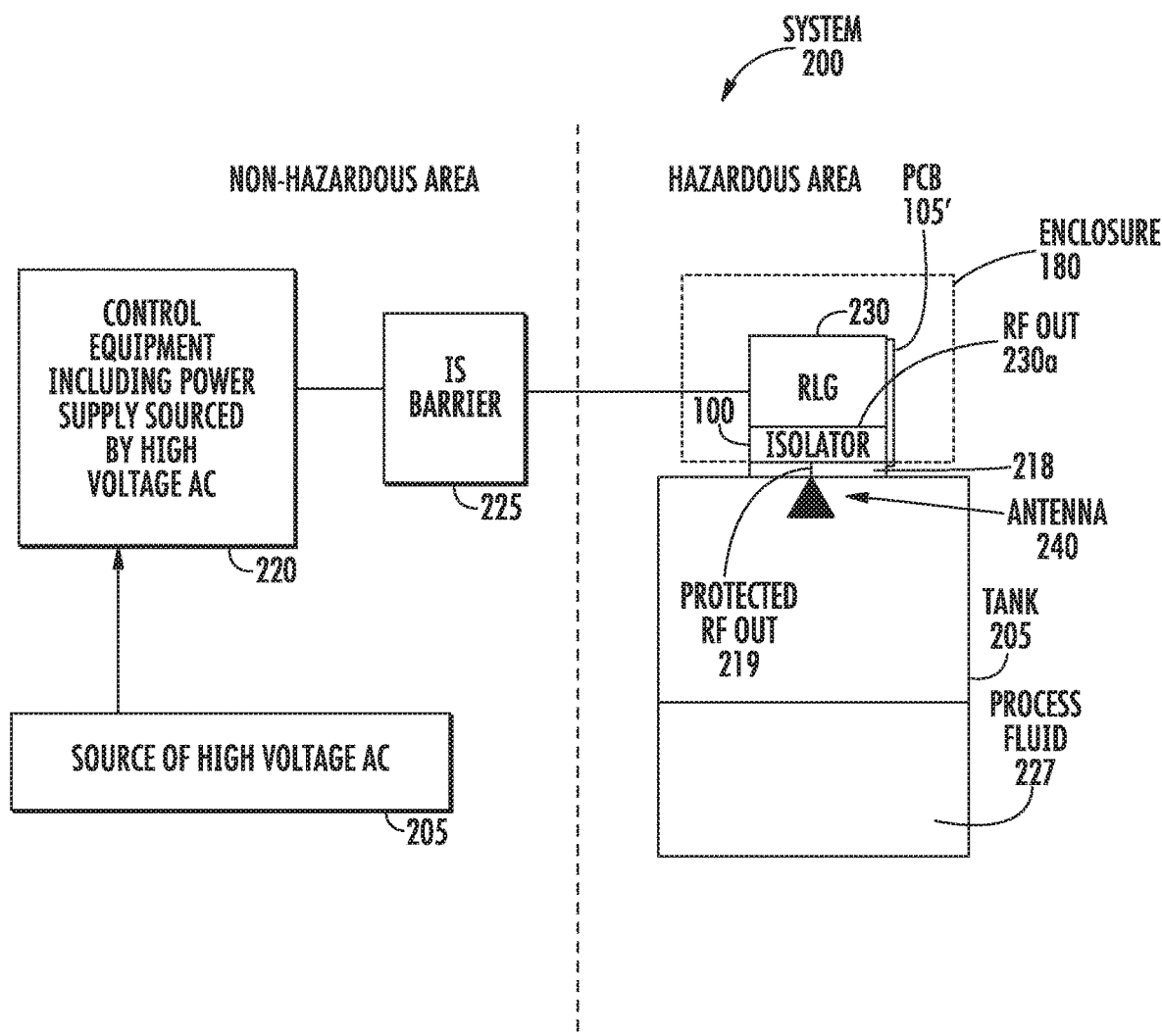
FIG. 2A depicts an example radar level gauge (RLG) system implementing NCR where the RLG is installed in an explosion proof housing, and the antenna is galvanically protected, where the galvanic isolator is positioned between the RLG and the antenna, according to an example embodiment.
Figure 2B:
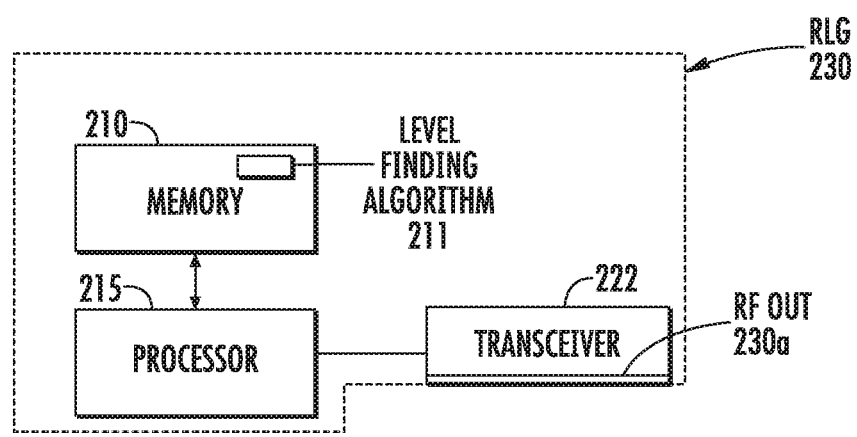
FIG. 2B shows example components for the RLG shown in FIG. 2A.

FIG. 2A depicts an example NCR system 200 where the RLG 230 is installed within an explosion proof enclosure 180 within a hazardous area, and the antenna 240 is galvanically protected, where the galvanic isolator 100 is between the RLG 230 and the antenna 240, according to an example embodiment. FIG. 2B shows example the components of the RLG 230. The galvanic isolator 100 is typically small in size, and is generally mounted on a small area common PCB shown as PCB 105' along with the electronics of the RLG 230.

In the non-hazardous there is shown AC mains frequencies provided by a source of AC voltage 205, typically 250 VAC at 50 or 60 Hz, which is shown coupled to control equipment (e.g., process controllers) 220. The control equipment 220 is coupled by an IS barrier 225 to the RLG 230. The IS barrier 225 can comprise capacitor and zener diodes, or other IS arrangements. The IS barrier 225 is optional, but may be needed depending on the level of DC power needed for the remainder of the electronics, that is needed only for protection from low frequency and DC.

As shown in FIG. 2B the RLG 230 includes a processor 215 which has an associated memory 210, where the transceiver 222 is coupled to the processor 215, and the associated memory 210 includes a stored level finding algorithm 211 (e.g., a Time Domain Reflectometry (TDR) algorithm). The processor 215 can comprise a microprocessor, digital signal processor (DSP), or a microcontroller unit (MCU). The RLG 230 provides an RF output 230a.

A process fluid 227 is shown in the tank 205 in FIG. 2A that is itself flammable and/or has a flammable gas above it. NCR system 200 includes a coaxial connector 218 that is on the top of the tank 205 with its center conductor coupled to the antenna 240 which is suspended at the top of the tank 205. The galvanic isolator 100 receives the RF output 230a from the RF input/output of the RLG 230 and outputs a protected RF output 219 that can be configured as a coaxial output. A flange (not shown) may also be present on the top of the tank 205. In operation of the NCR system 200, a transmitted pulse from the transceiver 222 is launched along antenna 240 which returns as the reflected pulse shown that is processed by the processor 215. The transmitted pulse may be at a carrier frequency of about 10 GHz to 100 GHz.

Disclosed embodiments include methods of limiting energy during fault conditions reaching an antenna of a RLG of a NCR system, where the RLG provides an RF output to the antenna for level sensing a product in a tank including a flammable material. A disclosed galvanic isolator such as galvanic isolator 100 including a disclosed embedded BP filter is positioned between the RF output and the antenna. The galvanic isolator blocks frequencies outside a passband of the BP filter and is designed to include the carrier frequency used in the NCF system to render the RF output a protected RF output. The value of capacitance of distributed capacitor is selected so that an impedance of the RF transmission line at the carrier frequency of system operation together with the capacitance provides the BP filter a pass band that includes the carrier frequency. As noted above the carrier frequency is generally between 10 GHz to 100 GHz.

Although generally described for NCR applications, disclosed galvanic isolators can also be applied to protect the electronics in other systems such as industrial analog data acquisition, and high-speed industrial communications. In all such systems, it is recognized that during fault conditions, including faults from a source of high voltage (e.g., AC mains supply) fed to the device(s) needs to be energy limited to help keep the RF output which enters the hazardous location/area low energy. In general any system that uses a high frequency carrier, typically as >10 GHz, can use a disclosed BP-based galvanic isolator.

EXAMPLES

Disclosed embodiments are further illustrated by the following specific Examples, which should not be construed as limiting the scope or content of this Disclosure in any way.

An example BP filter-based galvanic isolator was designed using the 3D electromagnetic simulation tool CST MICROWAVE STUDIO from Computer Simulation Technology or the high frequency structural simulator (HFSS) from Ansys. An initial design can be performed by a hand calculation of a stripline based on a design frequency of operation. These rough design numbers can then be used with the 3D electromagnetic simulation tools, and then refined to improve the performance of the BP filter-based galvanic isolator.

Figure 3A:
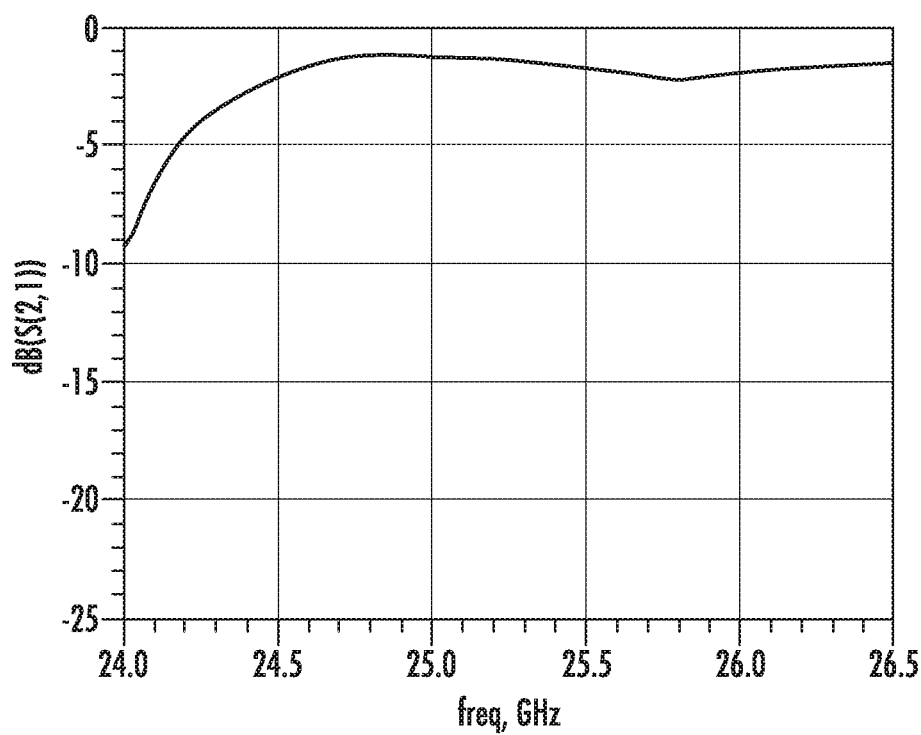
FIG. 3A shows simulated S21 data from an example BP filter-based galvanic isolator based on the BP filter-based galvanic isolator shown in FIG. 1A designed for operation around 25 GHz and FIG. 3B simulated S11 data for this example BP filter-based galvanic isolator.
Figure 3B:
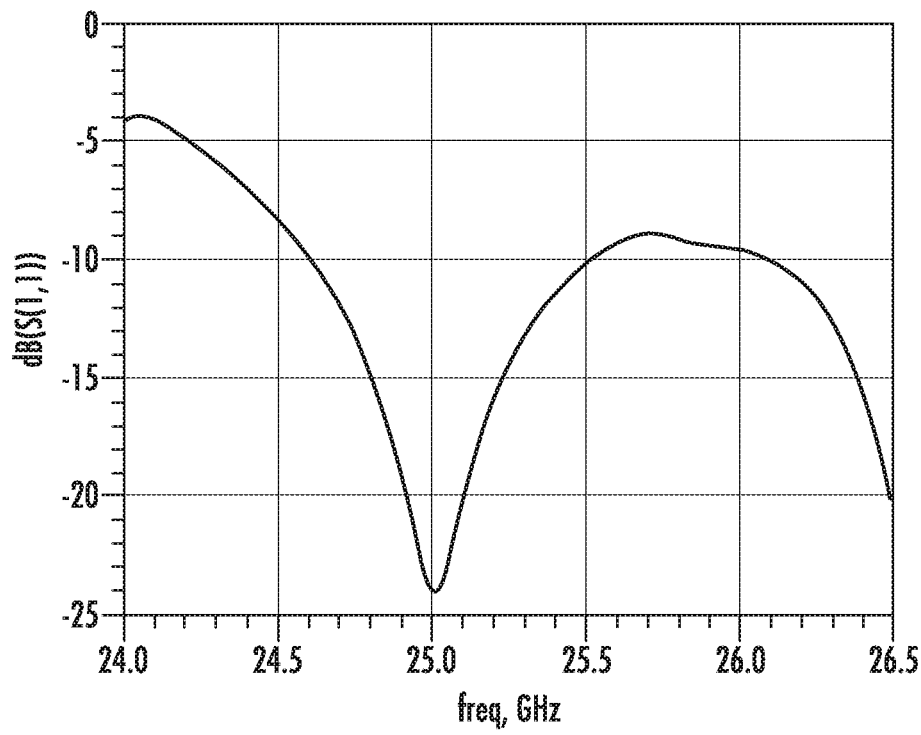

The two parameters that determine the performance of the BP filter-based galvanic isolator are the transmission curve (S21) and the reflection curve (S11). S21 generally needs to be close to "0" dB, where a S21 value of =0 dB indicates ideally that all RF power received by the BP filter-based galvanic isolator is delivered to its output. S11 generally needs to be <−10 dB as it indicates the reflected power the BP filter-based galvanic isolator is trying to deliver to its output. FIG. 3A shows simulated S21 data from an example BP filter-based galvanic isolator based on BP filter-based galvanic isolator 100 shown in FIG. 1 designed for operation around 25 GHz and FIG. 3B simulated S11 data for this example BP filter-based galvanic isolator. At 25 GHz, the S21 is shown to be about −1 dB and the S11 to be about −24 dB.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

The invention claimed is:

1. A galvanic isolator, comprising:
   a multi-layer printed circuit board (PCB) comprising a dielectric material having a top side and a bottom side;
   an RF transmission line embedded within said PCB including a plurality of conductor traces spaced apart from one another to include a plurality of gaps (G1 and G2) surrounding at least one of said conductor traces in a path of said RF transmission line to provide an inline distributed capacitor that together with an impedance of said RF transmission line forms a bandpass (BP) filter;
   a top metal layer on said top side and a bottom metal layer on said bottom side connected to one another by a plurality of metal filled vias on respective sides of said RF transmission line, wherein said top metal layer and said bottom metal layer each also include at least one gap; and
   a radar level gauge (RLG) comprising RLG electronics on said PCB, said RLG including a transceiver and an antenna, said galvanic isolator coupled between said transceiver and said antenna.

2. The galvanic isolator of claim 1, wherein a value of capacitance of said distributed capacitor is selected so that an impedance of said RF transmission line at a carrier frequency of operation together with said capacitance provides said BP filter a pass band that is between 10 GHz to 100 GHz.

3. The galvanic isolator of claim 1, wherein said galvanic isolator is configured in a symmetric stripline arrangement.

4. The galvanic isolator of claim 1, further comprising an explosion-proof housing, wherein said galvanic isolator is within said housing.

5. The galvanic isolator of claim 1, further comprising an explosion-proof housing, wherein said galvanic isolator and said RLG electronics are within said housing.

6. The galvanic isolator of claim 1, wherein said BP filter is a first order filter.

7. The galvanic isolator of claim 1, wherein a capacitance of said distributed capacitor is 0.3 pF to 50 pF.

8. The galvanic isolator of claim 1, wherein said galvanic isolator provides a protected RF output, and wherein said protected RF output is configured as a coaxial output.

9. A radar system for level sensing a product in a tank, comprising:
- a radar level gauge (RLG) comprising RLG electronics including a transceiver providing an RF output coupled to a coaxial connector having its center conductor coupled to an antenna at a top of said tank, wherein said transceiver is coupled to a processor which has an associated memory that includes a stored level finding algorithm, and
- a galvanic isolator comprising:
- a multi-layer printed circuit board (PCB) comprising a dielectric material having a top side and a bottom side, wherein said RLG is on said PCB
- an RF transmission line embedded within said PCB including a plurality of conductor traces spaced apart from one another to include a plurality of gaps (G1 and G2) surrounding at least one of said conductor traces in a path of said RF transmission line to provide an inline distributed capacitor that together with an impedance of said RF transmission line forms a bandpass (BP) filter,
- a top metal layer on said top side and a bottom metal layer on said bottom side connected to one another by a plurality of metal filled vias on respective sides of said RF transmission line (a stripline arrangement), wherein said top metal layer and said bottom metal layer each also include at least one gap, and
- an explosion-proof enclosure, said galvanic isolator coupled between said transceiver and said antenna, wherein said RLG and said galvanic isolator are both within said explosion-proof enclosure.

10. The system of claim 9, wherein a value of capacitance of said distributed capacitor is selected so that an impedance of said RF transmission line at a carrier frequency of operation together with said capacitance provides said BP filter a pass band that includes a carrier frequency used by said system that is between 10 GHz to 100 GHz.

11. The system of claim 9, further comprising an explosion-proof housing, wherein said galvanic isolator is within said housing.

12. The system of claim 9, wherein both said RLG and said galvanic isolator are formed on said PCB.

13. The system of claim 9, wherein said BP filter is a first order filter.

14. A method of limiting energy during fault conditions reaching an antenna of a radar level gauge (RLG) of a non-contact radar (NCR) system, said RLG providing an RF output to said antenna for level sensing a product in a tank including a flammable material, comprising:
- providing a galvanic isolator between said RF output and said antenna, wherein said galvanic isolator is coupled between a transceiver and said antenna, said galvanic isolator comprising:
- a multi-layer printed circuit board (PCB) comprising a dielectric material having a top side and a bottom side;
- an RF transmission line embedded within said PCB including a plurality of conductor traces spaced apart from one another to include a plurality of gaps (G1 and G2) surrounding at least one of said conductor traces in a path of said RF transmission line to provide an inline distributed capacitor that together with an impedance of said RF transmission line forms a bandpass (BP) filter, and
- a top metal layer on said top side and a bottom metal layer on said bottom side connected to one another by a plurality of vias on respective sides of said RF transmission line (a stripline arrangement);
- wherein said top metal layer and said bottom metal layer each also include at least one gap,
- said galvanic isolator blocking frequencies outside a passband of said BP filter to render said RF output a protected RF output.

15. The method of claim 14, wherein a value of capacitance of said distributed capacitor is selected so that an impedance of said RF transmission line at a carrier frequency of operation together with said capacitance provides said BP filter a pass band that includes a carrier frequency used by said NCR system that is between 10 GHz to 100 GHz.

16. The method of claim 14, wherein a capacitance of said distributed capacitor is 0.3 pF to 50 pF.

* * * * *